(12) United States Patent
Yoo et al.

(10) Patent No.: US 10,306,171 B2
(45) Date of Patent: May 28, 2019

(54) ANALOG-DIGITAL CONVERTER, READOUT CIRCUIT AND CIS INCLUDING THE SAME

(71) Applicants: SK hynix Inc., Gyeonggi-do (KR); Industry-University Cooperation Foundation Hanyang University, Seoul (KR)

(72) Inventors: Sang Dong Yoo, Seoul (KR); Min Kyu Kim, Seoul (KR); Jun Bo Shim, Seoul (KR)

(73) Assignees: SK hynix Inc., Gyeonggi-do (KR); Industry-University Cooperation Foundation Hanyang University, Seoul (KR)

( * ) Notice: Subject to any disclaimer, the term of this patent is extended or adjusted under 35 U.S.C. 154(b) by 54 days.

(21) Appl. No.: 15/605,096

(22) Filed: May 25, 2017

(65) Prior Publication Data

US 2018/0198999 A1   Jul. 12, 2018

(30) Foreign Application Priority Data

Jan. 12, 2017 (KR) .................. 10-2017-0004660

(51) Int. Cl.
*H03M 1/14* (2006.01)
*H03M 1/56* (2006.01)
*H04N 5/357* (2011.01)
*H04N 5/376* (2011.01)
*H04N 5/378* (2011.01)

(52) U.S. Cl.
CPC .............. *H04N 5/378* (2013.01); *H03M 1/14* (2013.01); *H03M 1/56* (2013.01); *H04N 5/3575* (2013.01); *H04N 5/3765* (2013.01)

(58) Field of Classification Search
CPC .. H04N 5/378; H04N 5/37455; H04N 5/3575; H04N 5/3765; H03M 1/56; H03M 1/14
See application file for complete search history.

(56) References Cited

U.S. PATENT DOCUMENTS 9,070,608 B2 * 6/2015 Kim ..................... H01L 27/146
2009/0195431 A1 * 8/2009 Snoeij ................... H03M 1/144
                                                              341/155
2012/0006974 A1 * 1/2012 Egawa ................. H04N 5/3742
                                                              250/208.1

(Continued)

FOREIGN PATENT DOCUMENTS

KR        1020140085239         7/2014
KR        101448917             10/2014

*Primary Examiner* — Timothy J Henn
(74) *Attorney, Agent, or Firm* — IP & T Group LLP (57) ABSTRACT

An analog-digital converter may include: an analog-digital converter comprising: a ramp signal selection unit suitable for receiving ramp signals having different offsets, and sequentially selecting one of the ramp signals according to a preset order; a comparison unit suitable for comparing the magnitudes of the selected ramp signal with a pixel signal, and outputting a comparison signal according to the comparison result; and a counting unit suitable for counting the number of clocks of a clock signal until the comparison signal transitions, and outputting a count signal based on the count when the comparison signal transitions.

16 Claims, 7 Drawing Sheets

(56) References Cited

U.S. PATENT DOCUMENTS

2013/0063627 A1* 3/2013 Hashimoto ............ H04N 5/378
                                                    348/241
2014/0225760 A1   8/2014 Yang
2017/0085817 A1*  3/2017 Yeh ..................... H03M 1/34

* cited by examiner

ANALOG-DIGITAL CONVERTER, READOUT CIRCUIT AND CIS INCLUDING THE SAME

CROSS-REFERENCE TO RELATED APPLICATIONS

The present application claims priority of Korean Patent Application No. 10-2017-0004660, filed on Jan. 12, 2017, which is incorporated herein by reference in its entirety.

BACKGROUND

1. Field

Exemplary embodiments of the present invention relate to a Complementary Metal Oxide Semiconductor Image Sensor (CIS), and more particularly, to an analog-digital converter which converts a pixel signal into a digital signal, a readout circuit and a CIS including the same.

2. Description of the Related Art

In general, an image sensor refers to a device which senses an optical image and converts the sensed image into digital image data. An image sensor is typically used as a core part of a mobile phone, a digital camera and the like, and may be divided into a Charge Coupled Device (CCD) or a Complementary Metal Oxide Semiconductor (CMOS) image sensor.

The CMOS image sensor (CIS) has high processing speed and low power consumption, and can be mass-produced as on-chip devices. The CMOS image sensor is widely employed in portable terminals such as a mobile phone and a digital camera. However, the CMOS image sensor has a disadvantage in that an image taken in a low-illumination environment contains a considerable amount of noise.

Recently, the Correlated Multiple Sampling (CMS) technique has been applied to the CMOS image sensor in order to allow taking an image with a high image quality in a low-illumination environment.

The CMS technique can repeatedly perform analog-digital conversion on the same pixel signal, before and after light exposure, thereby reducing the magnitude of noise generated in the pixel and circuit.

A conventional analog-digital converter employs the CMS technique that repeats the analog-digital conversion using the same ramp signal. Thus, when a time required for one analog-digital conversion operation is represented by TADC, the conventional analog-digital converter requires a total analog-digital conversion time of M×TADC in order to perform M analog-digital conversion operations.

As such, when using the CMS technique, the conventional analog-digital converter repeats the analog-digital conversion operation after completing a previous analog-digital conversion operation. Therefore, a total analog-digital conversion time required for the analog-digital conversion operations inevitably increases.

SUMMARY

Various embodiments of the present invention are directed to an analog-digital converter, a readout circuit and a CIS including the same.

In an embodiment, an analog-digital converter may include: a ramp signal selection unit suitable for receiving ramp signals having different offsets, and sequentially selecting one of the ramp signals according to a preset order; a comparison unit suitable for comparing the magnitudes of the selected ramp signal with a pixel signal, and outputting a comparison signal according to the comparison result; and a counting unit suitable for counting the number of clocks of a clock signal until the comparison signal transitions, and outputting a count signal based on the count when the comparison signal transitions.

In an embodiment, a Complementary Metal Oxide Semiconductor Image Sensor (CIS) may include: a pixel sensing unit suitable for sensing a pixel signal; an analog-digital converter suitable for repeating first to Mth analog-digital conversions on the pixel signal, using first to Mth ramp signals which have different offsets and gradually and simultaneously decrease with a same slope when the analog-digital conversions are started; and a digital processing unit suitable for calculating a final analog-digital conversion result using the first to Mth analog-digital conversion results.

In an embodiment, a readout circuit may include: a pixel sensing unit suitable for sensing a pixel signal; and an analog-digital converter suitable for repeating analog-digital conversions for the pixel signal using ramp signals having different offsets, wherein the analog-digital converter comprises: a ramp signal selection unit suitable for receiving the ramp signals, and sequentially selecting one of the ramp signals according to a preset order; a comparison unit suitable for comparing the magnitudes of the selected ramp signal with the pixel signal; and a counting unit suitable for counting the number of clocks in a clock signal until the selected ramp signal reaches the pixel signal, and outputting a count signal based on the count.

As such, the embodiments are capable of significantly reducing a total analog-digital conversion time by performing CMS using a plurality of ramp signals having different offsets at the same time.

BRIEF DESCRIPTION OF THE DRAWINGS

The above and other features and advantages of the present invention will become more apparent to those skilled in the art to which the present invention pertains by the following detailed description with reference to the attached drawings in which.

DETAILED DESCRIPTION

Various embodiments will be described below in more detail with reference to the accompanying drawings such that this disclosure will be thorough and complete, and will fully convey the scope of the present invention to those skilled in the art. Throughout the disclosure, like reference numerals refer to like parts throughout the various figures and embodiments of the present invention.

Moreover, detailed descriptions related to publicly known functions or configurations will be ruled out in order not to unnecessarily obscure subject matters of the present invention.

The terms such as first and second may be used to describe various components, but the components are not limited by the terms, and the terms are used only to distinguish one component from another component.

Figure 1:
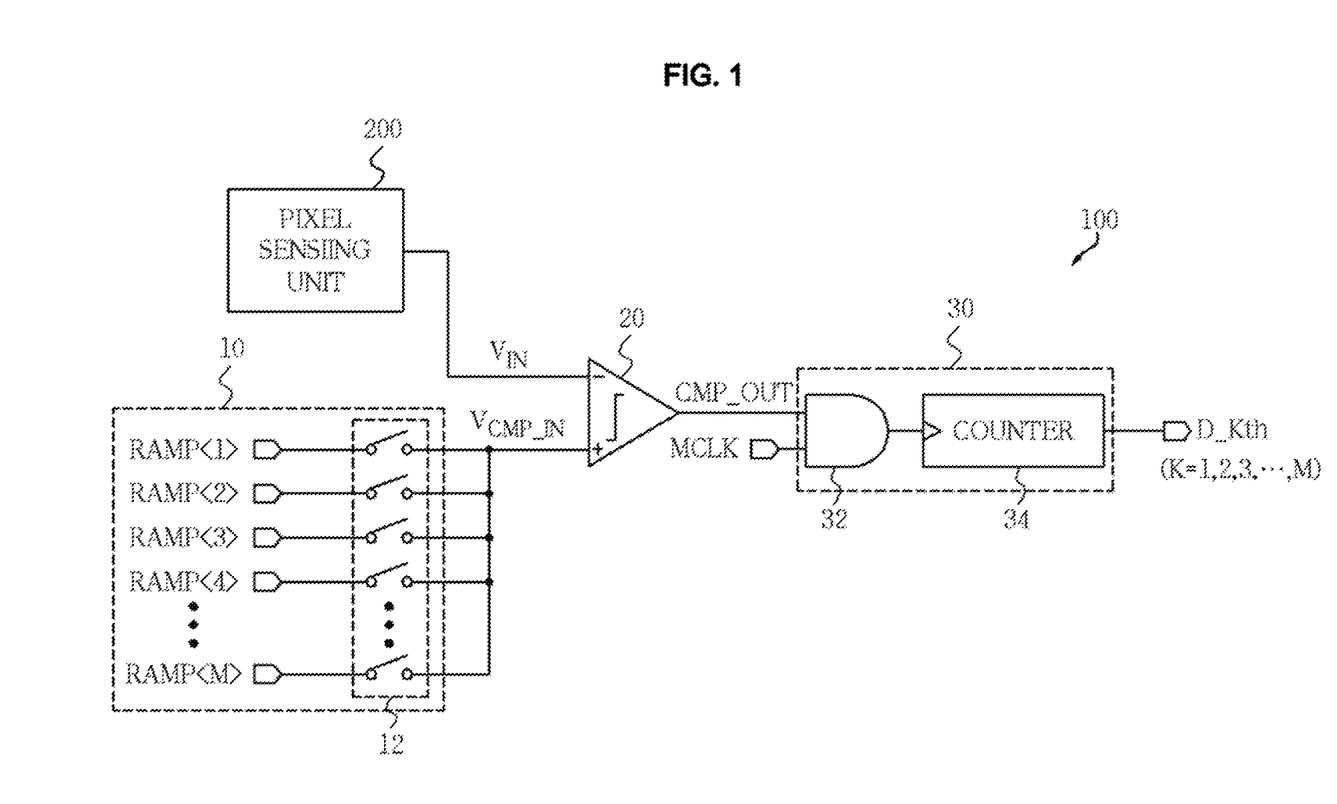
FIG. 1 is a diagram illustrating an analog-digital converter and a readout circuit including the same according to an embodiment of the present invention.

FIG. 1 is a circuit diagram illustrating an analog-digital converter and a readout circuit including the same according to an embodiment.

Referring to FIG. 1, the readout circuit according to the present embodiment includes a pixel sensing unit 200 and an analog-digital converter 100.

The pixel sensing unit 200 provides a pixel signal $V_{IN}$ sensed from a pixel to the analog-digital converter 100. For example, the pixel sensing unit 200 may include a pixel array (not illustrated) for sensing an optical image and converting the sensed image into an electrical signal and a sense amplifier (not illustrated) for amplifying the electrical signal and outputting the amplified signal as the pixel signal $V_{IN}$. At this time, the sense amplifier amplifies a difference between the initial voltage of a pixel and a signal voltage, and provides the amplified signal as the pixel signal $V_{IN}$ to the analog-digital converter 100.

The analog-digital converter 100 includes a ramp signal selection unit 10, a comparison unit 20 and a counting unit 30.

The ramp signal selection unit 10 receives M ramp signals RAMP<1:M> having different offsets, and sequentially provides the ramp signals RAMP<1:M> to the comparison unit 20. The ramp signal selection unit 10 includes a selector 12 for sequentially selecting the ramp signals RAMP<1:M>. The ramp signals RAMP<1:M> have different offsets, and simultaneously decrease with a same slope at different levels when analog-digital conversion is started. For example, the ramp signal selection unit 10 may sequentially select one of the ramp signals in an ascending order of the offsets, and provide the selected ramp signal to the comparison unit 20.

The comparison unit 20 compares the magnitudes of the pixel signal $V_{IN}$ and a comparison input signal $V_{CMP\_IN}$, and outputs a comparison signal CMP_OUT according to the comparison result. The pixel signal $V_{IN}$ is a signal sensed from a pixel of a pixel array (not illustrated), and the comparison input signal $V_{CMP\_IN}$ is one of the ramp signals RAMP<1:M> selected by the selector 12. For example, when the comparison input signal $V_{CMP\_IN}$ reaches the pixel signal $V_{IN}$, the comparison unit 20 changes the logic state of the comparison signal CMP_OUT from high to low.

The counting unit 30 receives the comparison signal CMP_OUT and a clock signal MCLK, counts the number of clocks of the clock signal MCKL until the logic state of the comparison signal CMP_OUT transitions, and outputs a count signal D_Kth. The counting unit 30 includes a logic unit 32 for transmitting the clock signal MCLK in response to the comparison signal CMP_OUT and a counter 34 for counting the clock signal MCLK. The count signal D_Kth represents a Kth count signal when analog-digital conversion for the same pixel is repeated M times. For example, the counting unit 30 counts the clock signal MCLK until the comparison input signal $V_{CMP\_IN}$ reaches the pixel signal $V_{IN}$ such that the comparison signal CMP_OUT transitions from high to low.

FIGS. 2 to 5 are circuit diagrams illustrating first to fourth analog-digital conversion operations of the analog-digital converter 100.

Figure 2:
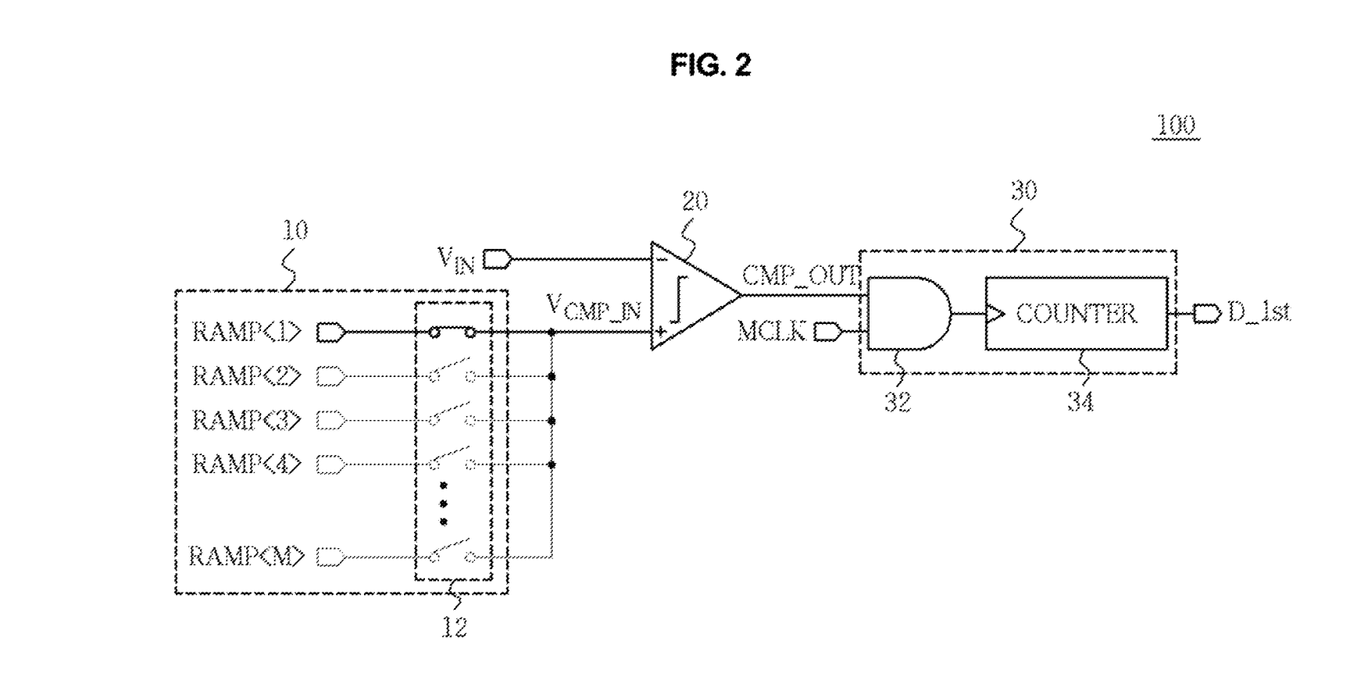
FIGS. 2 to 5 are circuit diagrams illustrating first to fourth analog-digital conversion operations of the analog-digital converter according to the embodiment of the present invention.

Referring to FIG. 2, the analog-digital converter 100 uses the ramp signal RAMP<1> for a first analog-digital conversion operation to the pixel signal $V_{IN}$.

The ramp signal selection unit 10 selects the ramp signal RAMP<1> as the comparison input signal $V_{CMP\_IN}$, and the comparison unit 20 compares the pixel signal $V_{IN}$ with the comparison input signal $V_{CMP\_IN}$, and outputs the comparison signal CMP_OUT according to the comparison result. The ramp signal RAMP<1> gradually decreases with a same slope at a preset level. The comparison signal CMP_OUT transitions from high to low when the ramp signal RAMP<1> decreasing with a same slope becomes smaller than the pixel signal $V_{IN}$.

The counting unit 30 counts the number of clocks in the clock signal MCLK until the comparison signal CMP_OUT transitions from high to low, and outputs a first count signal D_1st. When the ramp signal RAMP<1> becomes smaller than the pixel signal $V_{IN}$, the counting unit 30 is reset for a second analog-digital conversion operation.

Figure 3:
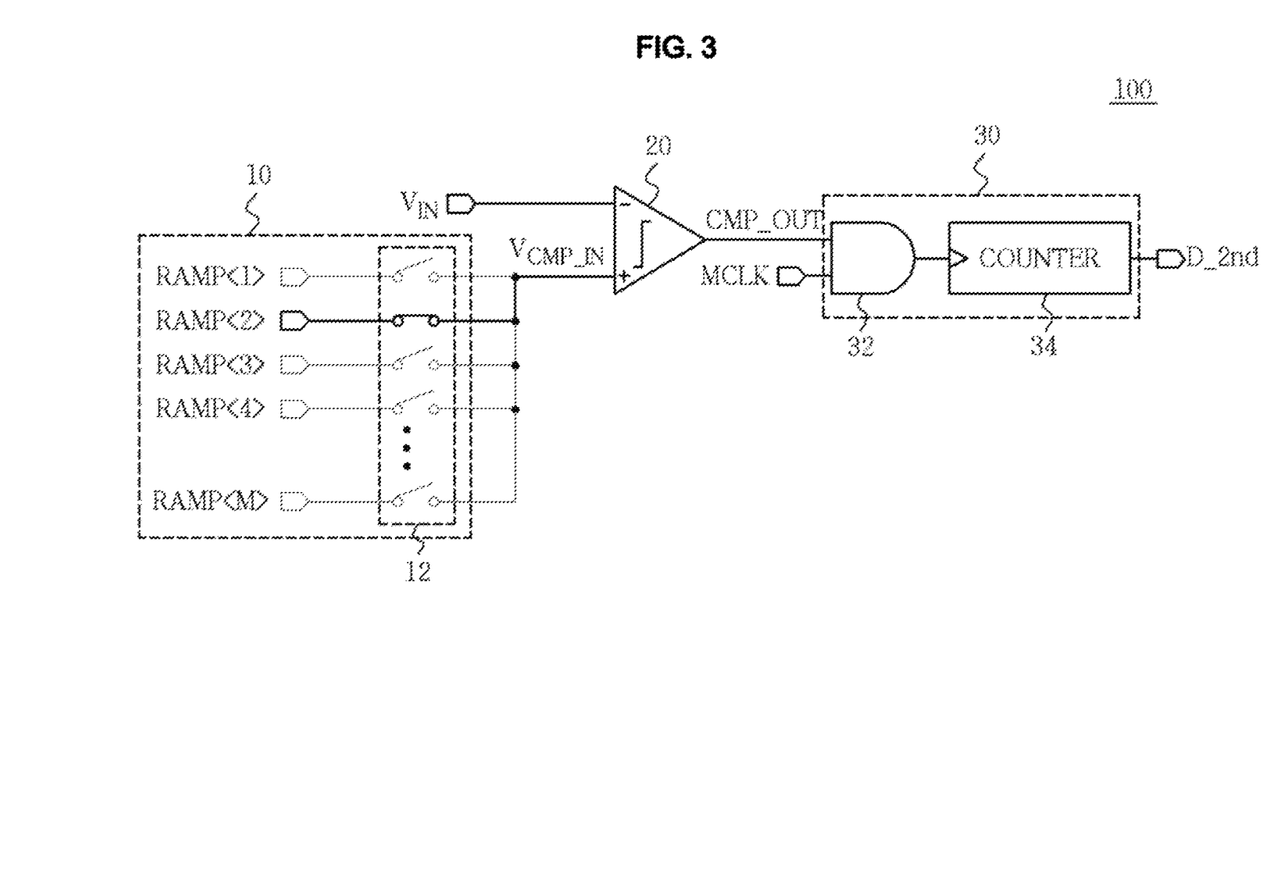

Referring to FIG. 3, the analog-digital converter 100 uses the ramp signal RAMP<2> for the second analog-digital conversion operation to the same pixel signal $V_{IN}$.

The ramp signal selection unit 10 selects the ramp signal RAMP<2> as the comparison input signal $V_{CMP\_IN}$, and the comparison unit 20 compares the pixel signal $V_{IN}$ with the comparison input signal $V_{CMP\_IN}$, and outputs the comparison signal CMP_OUT according to the comparison result. At this time, the ramp signal RAMP<2> has a positive offset voltage higher than the ramp signal RAMP<1>, and gradually decreases with the same slope as the ramp signal RAMP<1>.

When the ramp signal RAMP<2> having a positive offset voltage higher than the ramp signal RAMP<1> is selected, the comparison unit 20 changes the comparison signal CMP_OUT from low to high. Then, when the ramp signal RAMP<2> gradually decreases to a smaller value than the pixel signal $V_{IN}$, the comparison unit 20 changes the comparison signal CMP_OUT from high to low again.

The counting unit 30 counts the number of clocks in the clock signal MCLK until the comparison signal CMP_OUT transitions from high to low again, and outputs a second count signal D_2nd. When the ramp signal RAMP<2> is smaller than the pixel signal $V_{IN}$, the counting unit 30 is reset for a third analog-digital conversion operation.

Figure 4:
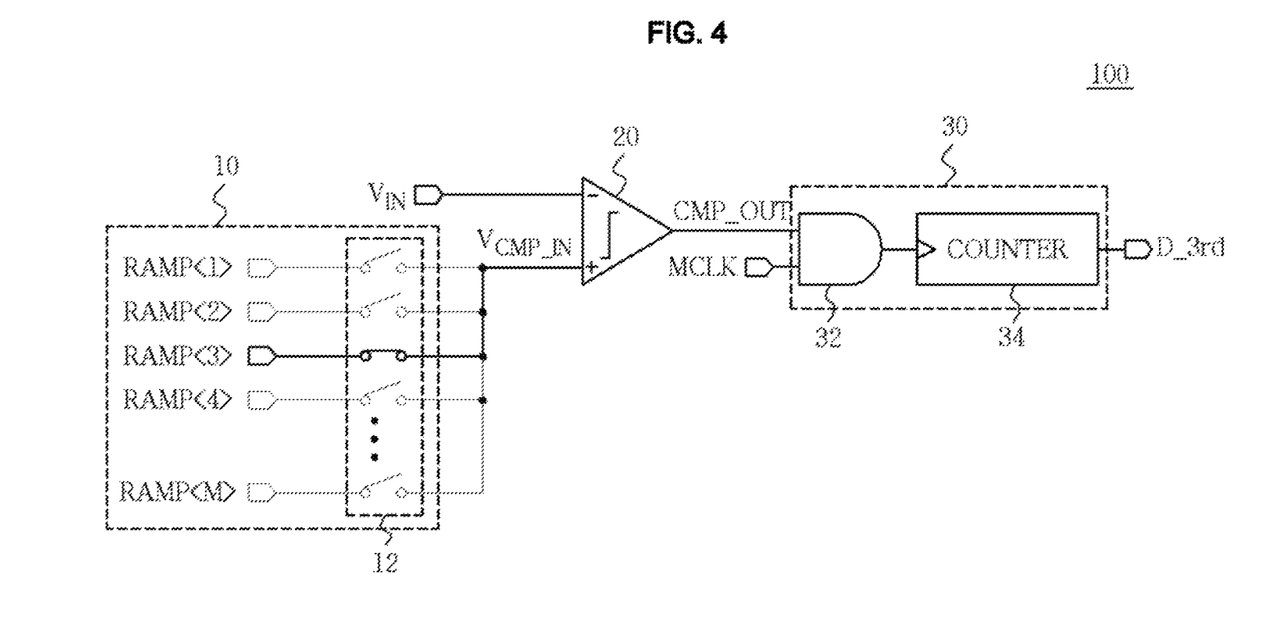
Figure 5:
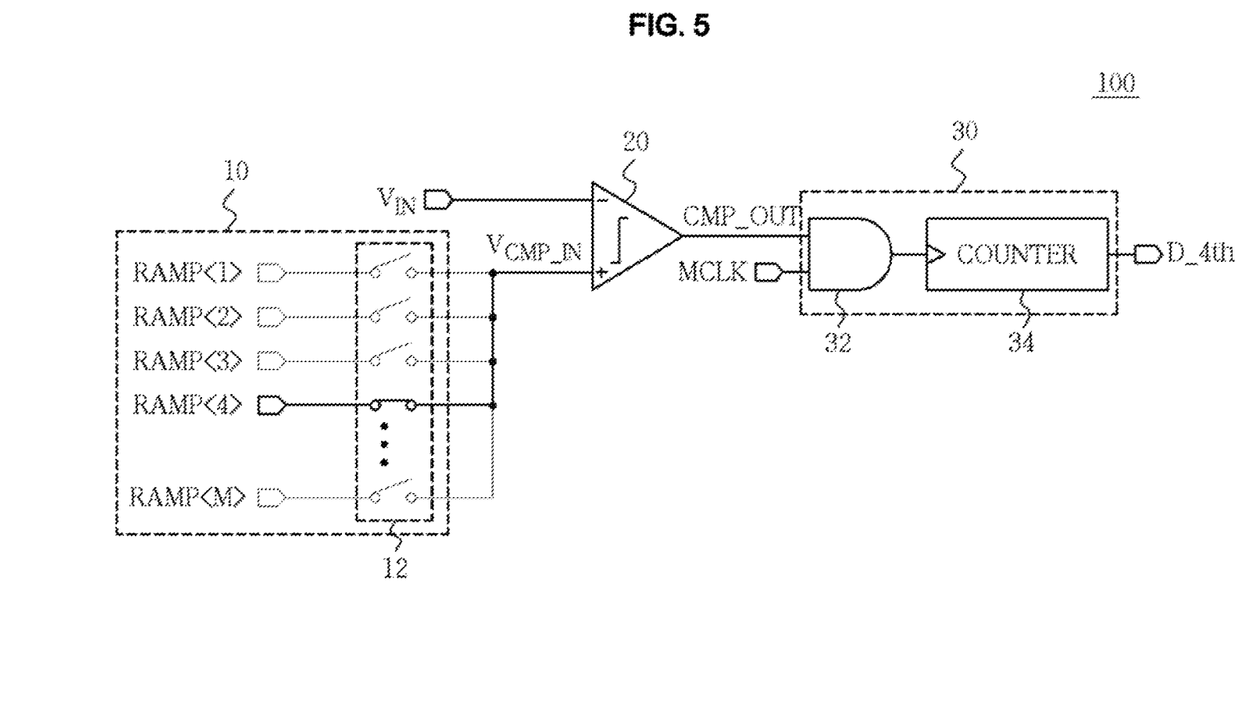

Referring to FIGS. 4 and 5, the analog-digital converter 100 sequentially uses the ramp signals RAMP<3:4> as the comparison input signal $V_{CMP\_IN}$ in order to perform the third and fourth analog-digital conversion operations in the above-described manner. The analog-digital converter 100 repeats the above-described analog-digital conversion operation, and sequentially outputs the third and fourth count signals D_3rd and D_4th.

Figure 6:
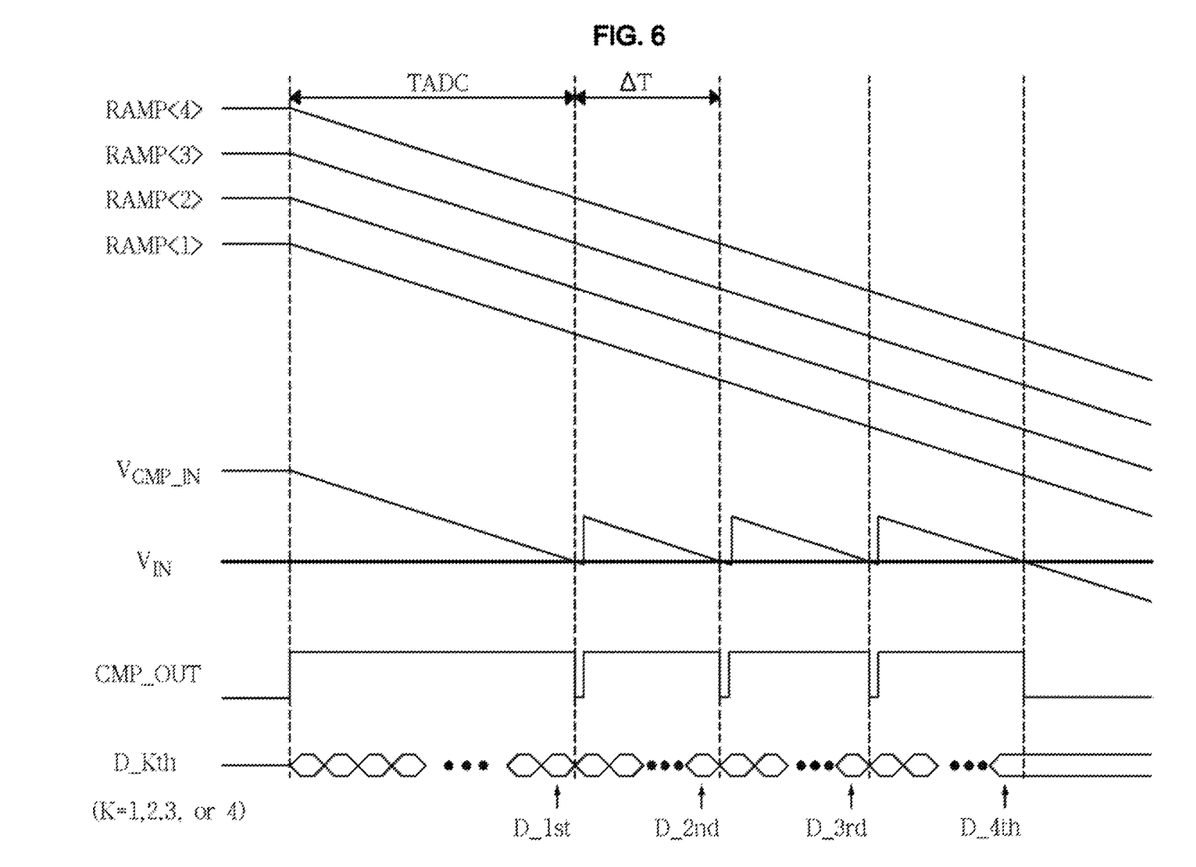
FIG. 6 is a timing diagram of the analog-digital converter according to the embodiment of the present invention.

FIG. 6 is a timing diagram of the analog-digital converter 100. In the present embodiment as illustrated in FIG. 6, the first to fourth ramp signals RAMP<1:4> simultaneously decrease with a same slope when analog-digital conversion is started, and the first to fourth ramp signals RAMP<1:4> are sequentially selected in ascending order of their offsets. However, the present embodiment is not limited thereto. In another embodiment, the analog-digital converter 100 may sequentially select one of the first to fourth ramp signals RAMP<1:4> in descending order of their offsets while the first to fourth ramp signals RAMP<1:4> have different offsets from each other and simultaneously increase with a same slope when analog-digital conversion is started. For convenience of description, FIG. 6 illustrates four ramp signals, that is, the first to fourth ramp signals RAMP<1:4>. However, the present embodiment is not limited thereto.

Referring to FIG. 6, the first to fourth ramp signals RAMP<1:4> have different offsets, and gradually and simultaneously decrease with a same slope at different levels when analog-digital conversion for the pixel signal $V_{IN}$ is started.

The analog-digital converter 100 selects the first ramp signal RAMP<1> as the comparison input signal $V_{CMP\_IN}$ during the first analog-digital conversion operation, counts the number of clocks in the clock signal until the selected comparison input signal $V_{CMP\_IN}$ becomes smaller than the pixel signal $V_{IN}$, and outputs the first count signal D_1st. When the comparison input signal $V_{CMP\_IN}$ becomes smaller than the pixel signal $V_{IN}$, the analog-digital converter 100 resets the first count signal D_1st by changing the comparison signal CMP_OUT from high to low.

Then, the analog-digital converter 100 selects the ramp signal RAMP<2> as the comparison input signal $V_{CMP\_IN}$ during the second analog-digital conversion operation, counts the number of clocks in the clock signal until the selected comparison input signal $V_{CMP\_IN}$ becomes smaller than the pixel signal $V_{IN}$, and outputs the second count signal D_2nd. When the comparison input signal $V_{CMP\_IN}$ becomes smaller than the pixel signal $V_{IN}$, the analog-digital converter 100 resets the second count signal D_2nd by changing the comparison signal CMP_OUT from high to low.

Then, the analog-digital converter 100 selects the ramp signal RAMP<3> as the comparison input signal $V_{CMP\_IN}$ during the third analog-digital conversion operation, counts the number of clocks in the clock signal until the selected comparison input signal $V_{CMP\_IN}$ becomes smaller than the pixel signal $V_{IN}$, and outputs the third count signal D_3rd. When the comparison input signal $V_{CMP\_IN}$ becomes smaller than the pixel signal $V_{IN}$, the analog-digital converter 100 reset the third count signal D_3rd by changing the comparison signal CMP_OUT from high to low.

Then, the analog-digital converter 100 selects the ramp signal RAMP<4> as the comparison input signal $V_{CMP\_IN}$ during the fourth analog-digital conversion operation, counts the number of clocks in the clock signal until the selected comparison input signal $V_{CMP\_IN}$ becomes smaller than the pixel signal $V_{IN}$, and outputs the fourth count signal D_4th. When the comparison input signal $V_{CMP\_IN}$ becomes smaller than the pixel signal $V_{IN}$, the analog-digital converter 100 resets the fourth count signal D_4th by changing the comparison signal CMP_OUT from high to low.

According to the above-described method, the analog-digital converter 100 performs the first to fourth analog-digital conversions on the same pixel using the ramp signals RAMP<1:4> which have different offsets and gradually and simultaneously decrease with a same slope during the analog-digital conversion operations, and sequentially outputs the first to fourth count signals D_1st, D_2nd, D_3rd and D_4th.

As illustrated in FIG. 6, during the first to fourth analog-digital conversion operations on the same pixel, the first analog-digital conversion result is the number of clocks in the clock signal MCLK until the ramp signal RAMP<1> reaches the pixel signal $V_{IN}$ from the start time of the first analog-digital conversion operation. The first analog-digital conversion result corresponds to the first count signal D_1st.

The second analog-digital conversion result is the clock number of the clock signal MCLK until the ramp signal RAMP<2> reaches the pixel signal $V_{IN}$ from the start time of the first analog-digital conversion operation because the ramp signals RAMP<1:2> having different offsets simultaneously decrease. The second analog-digital conversion result corresponds to the sum of the first and second count signals D_1st and D_2nd.

The third analog-digital conversion result is the number of clocks in the clock signal MCLK until the ramp signal RAMP<3> reaches the pixel signal $V_{IN}$ from the start time of the first analog-digital conversion operation because the ramp signals RAMP<1:3> having different offsets decrease simultaneously. The third analog-digital conversion result corresponds to the sum of the first to third count signals D_1st, D_2nd and D_3rd.

The fourth analog-digital conversion result is the number of clocks in the clock signal MCLK until the ramp signal RAMP<4> reaches the pixel signal $V_{IN}$ from the start time of the first analog-digital conversion operation because the ramp signals RAMP<1:4> having different offsets decrease simultaneously. The fourth analog-digital conversion result corresponds to the sum of the first to fourth count signals D_1st, D_2nd, D_3rd and D_4th.

When the first to fourth analog-digital conversion operations are repeated as described above, the final analog-digital conversion result $D_{CMS\_4}$ may be calculated using an average value of the analog-digital conversion results, as expressed in Equation 1 below.

$$D_{CMS\_4} = \frac{\left[\begin{array}{l} D_{1st} + (D_{1st} + D_{2nd}) + (D_{1st} + D_{2nd} + \\ D_{3rd}) + (D_{1st} + D_{2nd} + D_{3rd} + D_{4th}) \end{array}\right]}{4}$$

$$= \frac{1}{4} \cdot \sum_{k=1}^{4} (5-k) \cdot D_{kth}$$

[Equation 1]

Furthermore, when M analog-digital conversion operations are repeated, the first to Mth count signals D_1st to D_Mth can be obtained, and the final analog-digital conversion result $D_{CMS\_M}$ may be calculated as expressed in Equation 2 below.

$$D_{CMS\_M} = \frac{1}{M} \cdot \sum_{k=1}^{M} (M+1-k) \cdot D_{kth}$$

[Equation 2]

When the first to fourth analog-digital conversion operations are repeated, the time required for the first analog-digital conversion operation is represented by TADC, and a time difference between the ramp signals RAMP<1:4> having different offsets is represented by ΔT, a total time required for the first to fourth analog-digital conversion operations may be calculated as (TADC+3×ΔT).

Moreover, when M analog-digital conversion operations are repeated, a total analog-digital conversion time $T_{CMS\_M}$ may be calculated as expressed in Equation 3 below.

$$T_{CMS\_M} = T_{ADC} + (M-1) \cdot \Delta T$$

[Equation 3]

As described above, the analog-digital converter according to the present embodiment performs Correlated Multiple Sampling (CMS) using the plurality of ramp signals having different offsets at the same time. Thus, the analog-digital converter can significantly reduce the total analog-digital conversion time when compared to the conventional analog-digital converter.

Figure 7:
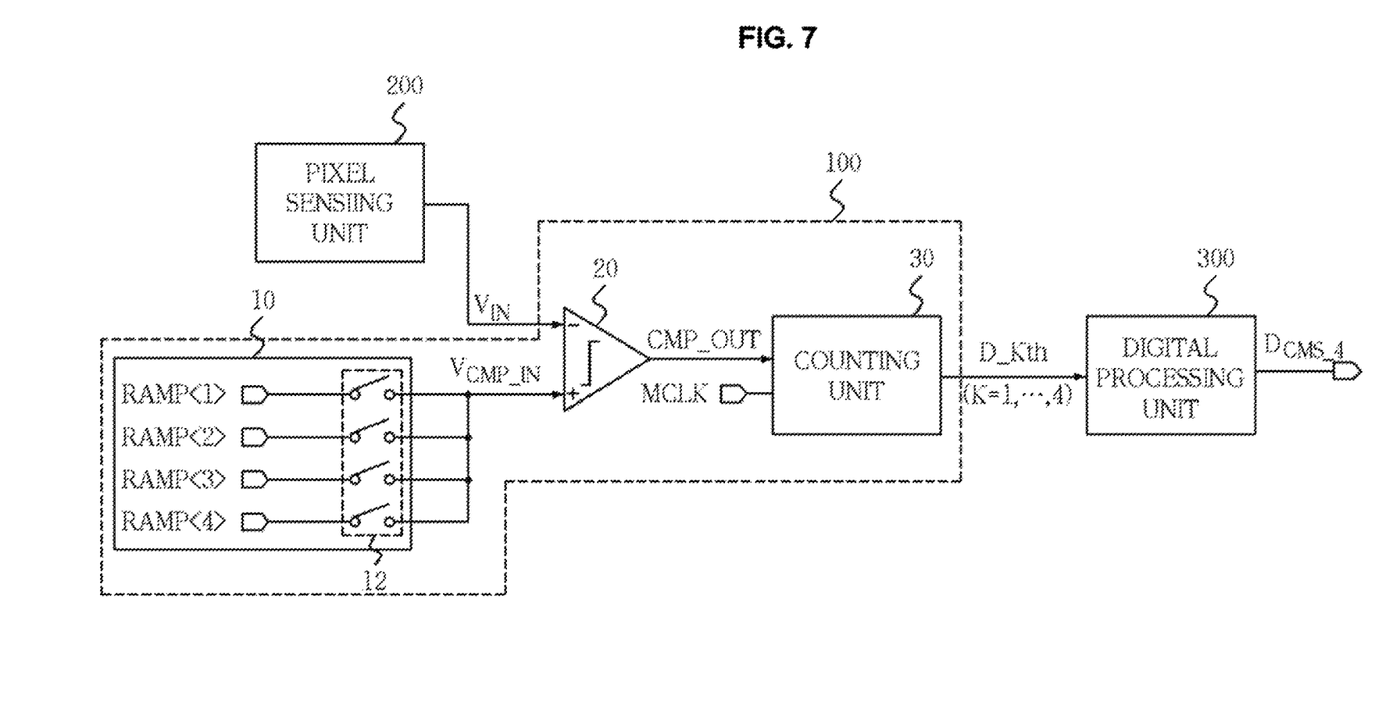
FIG. 7 is a block diagram of a CMOS image sensor including an analog-digital converter according to an embodiment of the present invention.

FIG. 7 is a block diagram of a CMOS image sensor (CIS) including the analog-digital converter 100. In the present embodiment, the case in which the first to fourth ramp signals RAMP<1:4> having different offsets are used for CMS will be exemplified, for convenience of description.

Referring to FIG. 7, the CIS according to the present embodiment includes the pixel sensing unit 200, the analog-digital converter 100 and a digital processing unit 300.

The pixel sensing unit 200 provides a pixel signal $V_{IN}$ sensed from a pixel of a pixel array to the analog-digital converter 100. For example, the pixel sensing unit 200 may include the pixel array (not illustrated) for sensing an optical image and converting the sensed image into an electrical signal and a sense amplifier (not illustrated) for amplifying the electrical signal provided from the pixel array and outputting the amplified signal as the pixel signal $V_{IN}$.

The analog-digital converter 100 repeats first to fourth analog-digital conversion operations on the same pixel using first to fourth ramp signals RAMP<1:4> which have different offsets and gradually and simultaneously decrease with a same slope when the analog-digital conversion operates are started.

The analog-digital converter 100 receives the first to fourth ramp signals RAMP<1:4> having different offsets, compares the magnitude of the pixel signal $V_{IN}$ with the magnitude of one ramp signal among the first to fourth ramp signals RAMP<1:4> which are sequentially selected according to a preset sequence, and sequentially outputs first to fourth count signals D_1st, D_2n, D_3rd and D_4th which are obtained by counting the number of clocks of the clock signal MCLK until the selected ramp signal $V_{CMP\_IN}$ reaches the pixel signal $V_{IN}$. The analog-digital converter 100 selects one of the first to fourth ramp signals RAMP<1:4> in ascending order of their offsets. When the selected ramp signal $V_{CMP\_IN}$ reaches the pixel signal $V_{IN}$, the analog-digital converter 100 resets the corresponding count signal, and then selects the next ramp signal. The descriptions of the detailed configuration of the analog-digital converter 100 in FIG. 7 may be replaced with the descriptions of FIG. 1.

The digital processing unit 300 calculates the final analog-digital conversion result $D_{CMS\_4}$ using the first to fourth count signals D_1st, D_2nd, D_3rd and D_4th. The first analog-digital conversion result corresponds to the first count signal D_1st, the second analog-digital conversion result corresponds to the sum of the first and second count signals D_1st and D_2nd, the third analog-digital conversion result corresponds to the sum of the first to third count signals D_1st, D_2n and D_3rd, and the fourth analog-digital conversion result corresponds to the sum of the first to fourth count signals D_1st, D_2nd, D_3rd and D_4th. That is because the first to fourth ramp signals RAMP<1:4> having different offsets gradually and simultaneously decrease with a same slope, when analog-digital conversion is started.

The digital processing unit 300 averages the first to fourth analog-digital conversion results as expressed in Equation 1, and outputs the final analog-digital conversion result $D_{CMS\_4}$ for the same pixel.

According to the present embodiments, the digital-analog converter and the CIS including the same can perform CMS using the plurality of ramp signals having different offsets at the same time, thereby reducing the total analog-digital conversion time.

In the present embodiments, when M analog-digital conversion operations are repeated, a total analog-digital conversion time of (TADC+(M−1)×ΔT) may be required. Here, TADC represents a time required for the first analog-digital conversion operation, and ΔT represents a time difference between the respective ramp signals. Therefore, the digital-analog converter and the CIS can reduce the total analog-digital conversion time, compared to the related art.

The present embodiments exemplify that the plurality of ramp signals that simultaneously decrease with a same slope are sequentially selected in ascending order of their offsets, when analog-digital conversion is started. However, the present embodiments are not limited thereto.

In another embodiment, the analog-digital converter may sequentially select a plurality of ramp signals in descending order of their offsets, when analog-digital conversion is started, the plurality of ramp signals having different offsets and simultaneously increasing with a same slope.

Although various embodiments have been described for illustrative purposes, it will be apparent to those skilled in the art that various changes and modifications may be made without departing from the spirit and scope of the invention as defined in the following claims.

What is claimed is:

1. An analog-digital converter comprising:
   a ramp signal selector configured to receive ramp signals having different offsets, and sequentially select one of the ramp signals according to a preset order;
   a comparator configured to compare the magnitudes of the selected ramp signal with a pixel signal, and output a comparison signal according to the comparison result; and
   a counter configured to count the number of clocks of a clock signal until the comparison signal transitions to output a count signal when the comparison signal transitions.

2. The analog-digital converter of claim 1, wherein the ramp signals simultaneously decrease with a same slope when analog-digital conversion is started.

3. The analog-digital converter of claim 2, wherein the preset order is an ascending order of the offsets.

4. The analog-digital converter of claim 1, wherein the ramp signals simultaneously increase with a same slope when analog-digital conversion is started.

5. The analog-digital converter of claim 4, wherein the preset order is a descending order of the offsets.

6. The analog-digital converter of claim 1, wherein when the selected ramp signal reaches the pixel signal, the ramp signal selector selects the next ramp signal based on the preset order.

7. The analog-digital converter of claim 6, wherein when the selected ramp signal reaches the pixel signal, the counter resets the count signal.

8. A Complementary Metal Oxide Semiconductor Image Sensor (CIS) comprising:
   a pixel array configured to sense a pixel signal;
   an analog-digital converter configured to repeat first to Mth analog-digital conversions on the pixel signal, using first to Mth ramp signals which have different offsets and gradually and simultaneously decrease with a same slope when the analog-digital conversions are started; and
   a digital processor configured to calculate a final analog-digital conversion result using the first to Mth analog-digital conversion results.

9. The CIS of claim 8, wherein the analog-digital converter comprises:
   a ramp signal selector configured to receive the first to Mth ramp signals, and sequentially select one of the first to Mth ramp signals according to a preset order;

a comparator configured to compare the magnitudes of the selected ramp signal with the pixel signal; and a counter configured to count the number of clocks in a clock signal until the selected ramp signal reaches the pixel signal to sequentially output first to Mth count signals.

10. The CIS of claim 9, wherein the first analog-digital conversion result corresponds to the first count signal, the second analog-digital conversion result corresponds to the sum of the first and second count signals, and the Mth analog-digital conversion result corresponds to the sum of the first to Mth count signals, and wherein the digital processor calculates the final analog-digital conversion result for the pixel signal by averaging the first to Mth digital conversion results.

11. The CIS of claim 9, wherein the preset order is an ascending order of the offsets.

12. The CIS of claim 11, wherein the ramp signal selector selects the next ramp signal when the selected ramp signal reaches the pixel signal.

13. The CIS of claim 12, wherein when the selected ramp signal reaches the pixel signal, the counter resets the first to Mth count signals.

14. A readout circuit comprising:

a pixel array configured to sense a pixel signal; and an analog-digital converter configured to repeat analog-digital conversions for the pixel signal using ramp signals having different offsets, wherein the analog-digital converter comprises:

a ramp signal selector configured to receive the ramp signals, and sequentially select one of the ramp signals according to a preset order;

a comparator configured to compare the magnitudes of the selected ramp signal with the pixel signal; and a counter configured to count the number of clocks in a clock signal until the selected ramp signal reaches the pixel signal, and output a count signal based on the count.

15. The readout circuit of claim 14, wherein the ramp signals gradually and simultaneously decrease with a same slope when analog-digital conversion is started.

16. The readout circuit of claim 15, wherein the preset order is an ascending order of the offsets.

* * * * *